United States Patent
Weber et al.

(10) Patent No.: US 9,714,989 B2
(45) Date of Patent: Jul. 25, 2017

(54) MULTICOMPONENT MAGNETIC FIELD SENSOR

(71) Applicant: SENSITEC GMBH, Lahnau (DE)

(72) Inventors: Sebastian Weber, Wetzlar (DE); Claudia Glenske, Leun (DE); Uwe Loreit, Wetzlar (DE)

(73) Assignee: SENSITEC GMBH, Lahnau (DE)

( * ) Notice: Subject to any disclaimer, the term of this patent is extended or adjusted under 35 U.S.C. 154(b) by 26 days.

(21) Appl. No.: 14/903,646

(22) PCT Filed: Jul. 18, 2014

(86) PCT No.: PCT/EP2014/065524
§ 371 (c)(1),
(2) Date: Jan. 8, 2016

(87) PCT Pub. No.: WO2015/011052
PCT Pub. Date: Jan. 29, 2015

(65) Prior Publication Data
US 2016/0169985 A1    Jun. 16, 2016

(30) Foreign Application Priority Data
Jul. 22, 2013 (DE) .......... 10 2013 107 821

(51) Int. Cl.
*G01R 33/09* (2006.01)
*G01R 33/00* (2006.01)
(Continued)

(52) U.S. Cl.
CPC .......... *G01R 33/09* (2013.01); *G01R 17/105* (2013.01); *G01R 33/0011* (2013.01); *G01C 17/02* (2013.01)

(58) Field of Classification Search
CPC .. G01R 33/09; G01R 33/0011; G01R 17/105; G01C 17/02
See application file for complete search history.

(56) References Cited

U.S. PATENT DOCUMENTS

| 5,521,501 A | 5/1996 | Dettmann et al. |
| 5,525,901 A * | 6/1996 | Clymer ............. G01R 33/09 324/207.21 |

(Continued)

FOREIGN PATENT DOCUMENTS

| DE | 3442278 A1 | 5/1986 |
| DE | 102008041859 A1 | 3/2010 |

(Continued)

OTHER PUBLICATIONS

Intenrational Search Report (Dec. 3, 2014) for corresponding International Appl. PCT/EP2014/065524.

*Primary Examiner* — Julian Huffman
*Assistant Examiner* — Michael Konczal
(74) *Attorney, Agent, or Firm* — WRB-IP LLP

(57) ABSTRACT

A magnetic field sensor apparatus for determining two or three components of a magnetic field includes at least one Wheatstone bridge with two half-bridges, wherein each half-bridge includes at least two bridge resistors, and at least one of the two bridge resistors is a magnetic-field-sensitive resistor with respect to a magnetic field component in an X/Y magnetic field sensor plane. Arranged symmetrically between the two magnetic-field-sensitive bridge resistors is a ferromagnetic flux concentration element which generates magnetic field components which are anti-symmetric with respect to a Z magnetic field component oriented perpendicular to the X/Y magnetic field sensor plane and are in the X/Y magnetic field sensor plane. A coordinate aspect proposes a method for determining a two-dimensional or three-dimensional orientation of an external magnetic field by such a magnetic field sensor apparatus.

11 Claims, 8 Drawing Sheets

(51) Int. Cl.
*G01R 17/10* (2006.01)
*G01C 17/02* (2006.01)

(56) References Cited

U.S. PATENT DOCUMENTS

| | | | | |
|---|---|---|---|---|
| 7,505,233 | B2* | 3/2009 | Grimm | G11B 5/00808 |
| | | | | 360/321 |
| 7,535,215 | B2* | 5/2009 | Forster | G01D 5/145 |
| | | | | 324/165 |
| 8,957,679 | B2* | 2/2015 | Loreit | G01D 1/00 |
| | | | | 324/244 |
| RE46,180 | E* | 10/2016 | Mather | B82Y 25/00 |
| 2004/0137275 | A1 | 7/2004 | Jander et al. | |
| 2013/0141090 | A1* | 6/2013 | Sidman | G01R 33/0011 |
| | | | | 324/252 |
| 2013/0169271 | A1 | 7/2013 | Nordman et al. | |

FOREIGN PATENT DOCUMENTS

| | | |
|---|---|---|
| DE | 102009008265 A1 | 8/2010 |
| WO | 2012116933 A1 | 9/2012 |

* cited by examiner

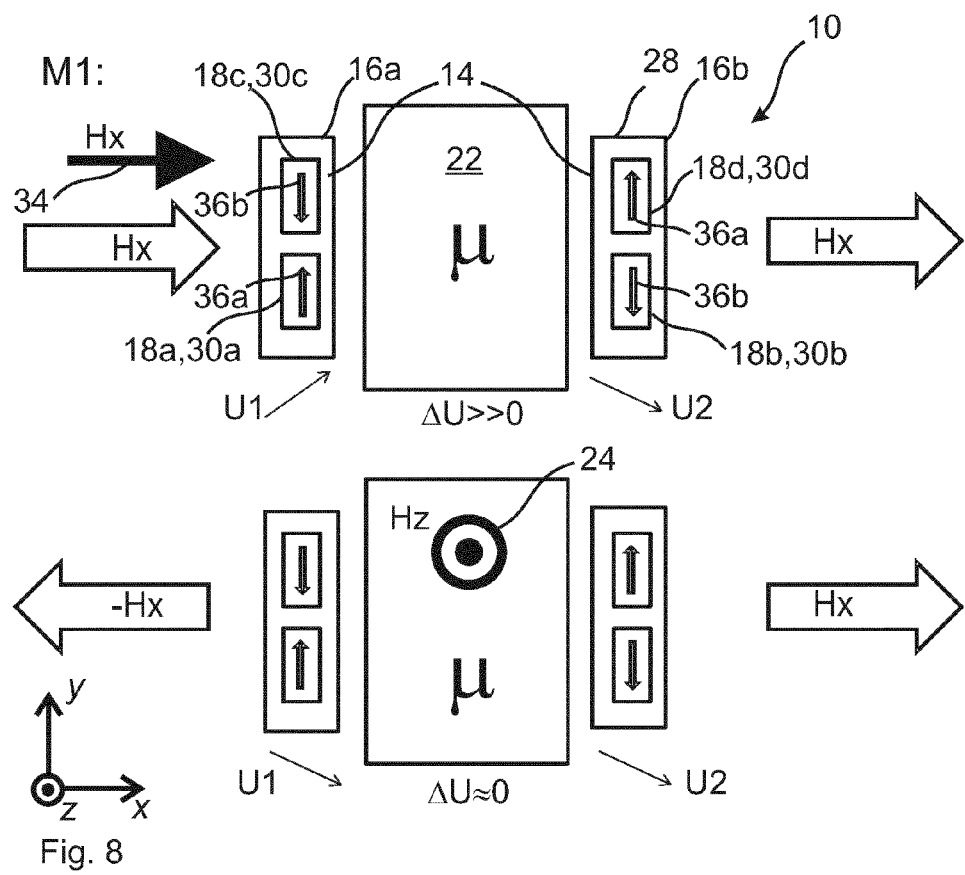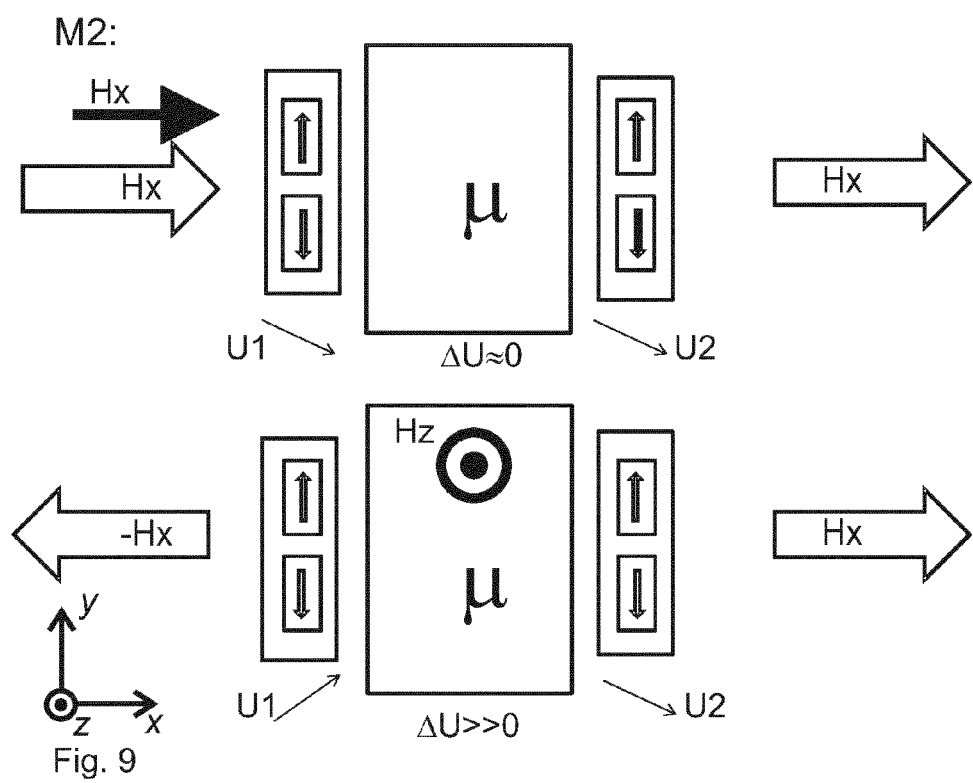
Fig. 8
Fig. 9

MULTICOMPONENT MAGNETIC FIELD SENSOR

BACKGROUND AND SUMMARY

The invention relates to a magnetic field sensor for measuring two or three components of a magnetic field. Magnetic field-sensitive measuring elements may take the form of magnetoresistive resistance elements or Hall elements. The arrangements are suitable for measuring magnetic fields of low intensity, such as for example to obtain an electronic compass.

Arrangements of the type in question are known. For instance, DE 10 2009 008 265 describes an arrangement in which a suitable configuration of magnetically soft flux guides makes it possible to measure a plurality of components of an external magnetic field. A unit composed of sensor element and flux guide is here required for measuring each of the components located in the sensor plane. An additional sensor element is required for measuring the perpendicular component, wherein a suitable flux guide guides or deflects the perpendicular component of the magnetic field to be measured in such a way that, at the sensor location, a horizontal magnetic field component located in the sensor plane is also formed which can then be detected by a sensor element.

DE 10 2008 041 859 describes an arrangement for measuring a Z magnetic field component oriented perpendicular to a magnetic field sensor plane, in which a plurality of sensor elements are interconnected to form a magnetic field sensor element unit and are arranged around an in particular circular flux guidance element. It is proposed to measure the perpendicular Z magnetic field component indirectly by determining horizontal, symmetrical compensating magnetic field components arising by means of the flux guidance element on the basis of a magnetic field non-uniformity in the Z magnetic field component at the outer circumference of the flux guidance element by means of the sensor elements arranged adjacent to the flux guidance element. Further sensor elements are capable of determining magnetic field components in the X/Y magnetic field sensor plane, at least three different magnetic field sensor element units being provided for three-dimensional field measurement. Using a plurality of sensor elements can bring about improvements in terms of measuring accuracy and immunity to interference. One drawback of the described solutions is the necessary space requirement for detecting a plurality of magnetic field components, as is typically required for compass applications.

For the purpose of designing magnetic field sensor devices, it is known from the prior art to arrange "barber's pole structures", i.e. thin conductive structures, on an AMR measuring strip, which consist of extremely conductive material such as for example aluminium, copper, gold or silver. The barber's pole structures are oriented at 45° relative to the longitudinal extent of the AMR resistance strip. A current flowing through the resistance strip is forced into a 45° direction to the longitudinal extent of the strip, as shown in FIG. 2. As a consequence, the curve in FIG. 1 showing the dependency of resistance on the orientation of the current vector is displaced by 45° to the magnetic field vector, such that, as shown in FIG. 2, it may be converted into a linearised region. As a function of the orientation of the barber's pole structures, a positive or negative flank is obtained for a linearisation between resistance and magnitude of the magnetic field to be measured.

Magnetic field sensor devices which are based on barber's pole structures are known for example from DE 344 22 78 A1. Four such magnetic field sensor devices with differently oriented barber's pole structures are here interconnected in a Wheatstone measuring bridge, wherein an external magnetic field, which is generated by a macroscopic magnet coil premagnetises the internal magnetisation $M_0$ of the resistance strip in order to bring about a linearised resistance dependency on the external magnetic field $H_e$.

DE 43 191 46 C2 describes an improvement to such a design. Said document proposes arranging a series of AMR resistance devices with barber's pole structures along a conductor through which a flip current is flowing, wherein the flip current conductor brings about premagnetisation $M_0$ in the longitudinal direction of the AMR measurement strips. By flipping, i.e. reversing, the internal magnetisation, it is possible to reorient or calibrate resistance behaviour. The arrangement is capable of precisely measuring one component of an external magnetic field. For measuring the second component located in the sensor plane, it is sufficient to provide a further resistance device rotated by 90°. In order to measure the further component, further arrangements with a corresponding additional space requirement must be provided. In order to determine a three-dimensional course of a magnetic field, three magnetic field sensor element units are generally provided in the form of Wheatstone measuring bridges which are each offset from one another by 90°. Each sensor element measuring bridge can thus measure one component, wherein the measuring bridge must be oriented in the X, Y and Z direction. In particular the arrangement in the Z direction, i.e. perpendicular to a chip substrate or PCB substrate, requires a large installation space and elevated manufacturing complexity for producing a 3D sensor.

On the basis of the above-stated prior art, the problem arises of providing a 2D or 3D sensor which is simple to manufacture and is capable of determining both a magnetic field component in a sensor element plane and a component perpendicular thereto. It is desirable to provide a compact and interference-proof measurement of a plurality of components of a magnetic field.

An aspect of the invention proposes a magnetic field sensor device for determining two or three components of a magnetic field which comprises at least one Wheatstone bridge with two half-bridges, each half-bridge comprising at least two bridge resistors. At least one of the two bridge resistors is a magnetic field-sensitive resistor with a direction of sensitivity located in an X/Y plane. A ferromagnetic flux concentration element is arranged symmetrically between the two magnetic field-sensitive bridge resistors which, with regard to a Z magnetic field component oriented perpendicular to the X/Y magnetic field sensor plane, generates antisymmetric magnetic field components located in the X/Y magnetic field sensor plane.

In other words, at least two half-bridges of a Wheatstone measuring bridge are proposed, the bridge resistors of which comprise magnetoresistive elements arranged opposite a magnetically soft flux guidance unit. The directions of magnetisation of the magnetoresistive elements and thus the directions of sensitivity of the sensor elements may here be set approximately parallel or antiparallel. The opposing half-bridges may be interconnected to form a "Wheatstone measuring bridge".

To simplify explanation of the solution according to the invention, the component located in the plane is hereinafter designated the X component and the component located perpendicular to the sensor arrangement is designated the Z component. The direction of sensitivity of a sensor element is assumed to be in the X direction.

Magnetic field components of a magnetic field which are located in the X/Y sensor plane bring, about, due to the component located in the X direction, a first resistance behaviour in the magnetosensitive bridge resistors in the two half-bridges which acts upon a differential voltage $\Delta U=U1-U2$ between the centre taps of the bridge or upon a voltage change U1, U2 of the centre taps in relation to a reference potential U0. Thanks to the flux concentration element, a Z magnetic field component brings about two antisymmetric field components which are located in the X/Y sensor plane, and produces a second resistance behaviour in the magnetosensitive bridge resistors. Thus, given known resistance behaviour of the centre tap voltages U1, U2 on an X magnetic field component, suitable evaluation electronics are capable of determining a magnitude of both the X magnetic field component and the Z magnetic field component. Since the directions of magnetisation are set such that the signal components from the two half-bridges are additive in the full bridge, the arrangement is accordingly sensitive to the X component. Due to presence of the flux guidance unit, any Z component which is present in the half-bridges will provide components which are exactly opposed in sign and will then make no contribution to the overall signal due to addition of the signal components in the full bridge.

The arrangement according to the invention thus permits the detection of two magnetic field components which are perpendicular to one another by the direction of sensitivity in at least one half-bridge being switchable.

According to an advantageous embodiment, the magnetic field-sensitive bridge resistors may be AMR, GMR or TMR resistors. These resistors have a magnetic field-sensitive preferential direction, in which said resistors respond to a change in the magnetic field component with a change in ohmic resistance. The resistance characteristic curve behaviour of AMR resistors may be influenced by influencing an internal premagnetisation, such that the resistance characteristic curve may be switchably modified to evaluate the X and Z component.

According to one advantageous embodiment, the circuit arrangement of at least the bridge resistors of one half-bridge may be individually switchable. Modified resistance behaviour is consequently obtained with regard to an X component, such that it is possible to distinguish between an effect in the case of an X and a Z magnetic field component.

According to one advantageous embodiment, at least one and preferably all of the magnetic field-sensitive bridge resistors have a switchable resistance characteristic curve. By switching an internal direction of magnetisation in at least one magnetoresistive bridge element and by suitable signal evaluation with these two or more half-bridges, it is now possible to measure both a horizontal magnetic field component, namely a component located in the sensor plane, and a magnetic field component located perpendicular to the sensor plane.

If the direction of magnetisation and consequently therefore the direction of sensitivity in one half-bridge is set such that, in the presence of magnetic field components in the X direction, the respective contributions in the full bridge exactly cancel each other out due to difference calculation, the arrangement is in this state insensitive to components in the X direction. If, however, a Z component is present in the magnetic field to be measured, said component makes contributions of opposing sign in the half-bridges. Difference calculation in the full bridge thus gives rise to a measurement signal for the Z component of the magnetic field to be measured.

One advantageous embodiment may comprise at least one premagnetisation switching unit, in particular a flip conductor, which is capable of flipping, i.e. reversing the magnetisation of an internal magnetisation for defining the resistance characteristic curve of at least one magnetic field-sensitive bridge resistor. By means of a flip conductor, in particular a flip conductor individually associated with each magnetic field-sensitive bridge resistor, which may be guided for example in a spiral or zigzag configuration below or above the magnetic field-sensitive bridge resistor, it is possible to generate a flip magnetic field which can modify an internal premagnetisation state of the bridge resistor and thus the resistance characteristic curve behaviour which is shown in FIG. 2, by specifying a brief flip current pulse individually for each of the magnetic field-sensitive bridge resistors.

It is in principle sufficient for two of the four bridge resistors to be of magnetosensitive construction. These may be the two lower, the two upper or diagonally associated bridge resistors of the two half-bridges of the resistance measuring bridge. According to one advantageous embodiment, all the resistors of the Wheatstone measuring bridge may be magnetic field-sensitive resistors. Improved sensitivity of the magnetic field sensor device is achieved in this manner.

According to one advantageous embodiment, two Wheatstone measuring bridges may be included, the orientation of the measurement-sensitive magnetic field components, located in the X/Y magnetic field sensor plane, of the two measuring bridges being selected at right angles, i.e. is perpendicular to each other. The two measuring bridges are offset by 90° to one another in the X/Y plane, such that one measuring bridge is sensitive to a magnetic field component in the X direction and a further measuring bridge is sensitive to a magnetic field component in the Y direction. A Z component may have an influence on both measuring bridges, if the two measuring, bridges are arranged symmetrically around the flux concentration element. A Z component may thus be determined by means of the two Wheatstone measuring bridges. The two values of the Z component may advantageously be averaged in order to achieve higher accuracy in the determination of the Z component. It is alternatively conceivable for the half-bridges of an individual measuring bridge to be arranged symmetrically with regard to the flux concentration element, such that a Z magnetic field component is only measurable with regard to one of the two measuring bridges.

The flux-influencing action of the flux concentration element resides in an extremely high magnetic permeability $\mu$, whereby the Z magnetic field component is literally drawn into, i.e. concentrated in, the flux concentration element, such that nonuniformities in the Z magnetic flux density arise at the peripheral zone of the advantageously cuboidal or cubic flux concentration element. As a result, as shown in FIG. 3, the flux guidance concentration of the Z magnetic field component gives rise, along the periphery of the advantageously plate-shaped flux concentration element, to magnetic field components which are located in the X/Y magnetic field component and point perpendicularly either towards or away from the edge of the flux concentration element. According to one advantageous embodiment, the ferromagnetic flux concentration element may consist of iron, cobalt, nickel, a ferromagnetic alloy such as AlNiCo, SmCo, $Nd_2Fe_{14}B$, $Ni_{80}Fe_{20}$ (Permalloy), NiFeCo alloy or a combination thereof. A ferromagnetic flux concentration element has an elevated magnetic susceptibility and thus an elevated permittivity μ, such that extremely large Z magnetic field component flux density nonuniformities may be brought about at the peripheral zone of the flux concentration element.

According to one advantageous embodiment, the ferromagnetic flux concentration element may have a symmetrical shape, in particular a mirror-symmetrical or rotationally symmetrical shape, in particular a rectangular, in particular a square shape in the X/Y magnetic field sensor plane, wherein the side edges of the flux concentration element are oriented in the X/Y direction. A symmetrical shape promotes the formation of antisymmetric X/Y magnetic field components due to the Z magnetic field component, such that the resistance in the half bridges of the resistance measuring bridge due to the Z magnetic field component changes symmetrically. The flux concentration element preferably takes the form of a cuboid or a cube. Preferred dimensions of the flux concentration element may be in the range of 190-1000 μm.

According to an advantageous embodiment, an upper or a lower surface of the flux concentration element may be located in the X/Y magnetic field sensor plane. The X/Y magnetic field sensor plane defines a plane oriented parallel to the chip substrate surface or board substrate surface, in which the magnetic field-sensitive resistors are arranged and in which a maximum sensitivity is achieved with regard to a magnetic field component located therein. As is clear from FIG. 3, the course of a Z magnetic field component is maximally deflected in the region of the upper and lower surface of the flux concentration element, such that the largest X and Y magnetic field components arise in the lower and upper surface planes of the flux concentration element due to the flux concentration action. By arranging the X/Y magnetic field sensor plane in the plane of the upper or lower surface of the flux concentration element, it is possible to achieve the highest magnetic field sensitivity with regard to a change in the Z magnetic field component.

A secondary aspect proposes a method for determining two or three components of a magnetic field by an above-described magnetic field sensor device, wherein a magnetic field sensor component located in an X/Y sensor plane in the two half-bridges brings about a voltage change U1, U2 at the centre tap of the half-bridge in a first change in magnitude and, in the Z direction perpendicular to the X/Y sensor plane, a different voltage change in a second change in magnitude. A magnetic field component located in the sensor plane thus has an identical effect on the magnetosensitive resistors of the two half-bridges. Depending on the resistance characteristic curve profiles of the resistors and the assignment to the half-bridges, the half-bridge centre tap voltages U1, U2 change in such a manner that a differential voltage ΔU is increased or minimised. A Z magnetic field component brings about antisymmetric magnetic field components in the sensor plane which act in opposing directions on the magnetosensitive resistors. This brings about opposing behaviour of the centre tap voltages U1, U2. The influence of a Z magnetic field component on the resistance behaviour of the measuring bridge is thus opposite to an influence of an external magnetic field component located in the sensor plane. Evaluation electronics recognise these opposing changes in resistance and, if the specific resistance behaviour is known, can draw a conclusion both as to the magnitude of the Z component and as to the magnitude of X or X and Y component. Thus, using an individual measuring bridge, it is possible to detect two magnetic field components located perpendicular to one another, wherein one component is in the sensor plane and one magnetic field component is perpendicular thereto.

According to one advantageous embodiment of the method, switching of at least one, in particular switching in pairs, of the resistance characteristic curves of mutually associated magnetic field-sensitive resistors of the two half-bridges or switching of the circuit arrangement of the bridge resistors may proceed in at least one half-bridge or switching of the supply voltage may proceed in at least one half-bridge, wherein in a first state M1, M3 an X/Y-located magnetic field component is measurable by oppositely directed resistance characteristic curve profiles of mutually corresponding magnetic field-sensitive bridge resistors and in a second state M2, M4 a magnetic field component located in the Z direction is measurable by identically directed resistance characteristic curve profiles of mutually corresponding magnetic field-sensitive bridge resistors. A state M1 may be defined as oppositely directed resistance characteristic, curves of two mutually associated magnetic field-sensitive resistors of the two half-bridges of a resistance measuring bridge. As a consequence, for example in the event of an X magnetic field component arising, the resistance of a first magnetic field-sensitive resistor of the first half-bridge rises and the resistance of a second magnetic field-sensitive resistor of the second half-bridge falls. If both resistors are arranged as lower resistors of the half-bridge, the differential voltage ΔU=U1−U2 increases. A Z magnetic field component brings about antisymmetric X magnetic field components, the differential voltage ΔU falling towards zero as a result. A state M3 may be defined in the same way, wherein the first and the second resistors exhibit opposing behaviour of the resistance characteristic curve in relation to the state M1. In the state M1, a component oriented in a positive X direction would result in a positive differential voltage ΔU>0 and in the state M3 it would result in a negative differential voltage ΔU<0. A Z component minimises the differential voltage ΔU≈0. The states M2 and/or M4 mean identically directed behaviour of the resistance characteristic curves of the lower resistor of the first half-bridge and lower resistor of the second half-bridge. An X magnetic field component consequently minimises the differential voltage ΔU≈0 and a Z magnetic field component brings about a positive differential voltage ΔU>0 (state M2) or a negative differential voltage ΔU<0.

According to a preferred method, switching of the states may proceed in the sequence M1, M2, M1 and M2 or M1, M2, M3 and M4. Thanks to sequential switching, for example in the specified state sequences, the magnitude of the X and Z magnetic field components may be considered in isolated manner, wherein in the state M1, M3 the differential voltage can provide information about the magnitude and sign of the X component and in the state M2, M4 it can provide information about the magnitude and sign of the Z component.

A voltage offset of the measuring bridge may advantageously be filtered out by an evaluation unit. The evaluation unit may set the specified states M1-M4 for example by outputting a flip current pulse or switching of the circuit connection between the bridge resistors or the polarity of the half-bridge voltage and then record a differential voltage ΔU or half-bridge voltages U1, U2. Depending on the application, the state switching frequency may range from a few Hz to the kHz range. An offset between the two half-bridge voltages, which is the result of manufacturing nonuniformities in the resistors and can be determined in the magnetic field-free state, may be taken into account and filtered out by the evaluation unit in order to achieve elevated accuracy of the magnetic field measurement.

Further conceivable parameters for defining the magnetic field sensor device are the dimensions of the chips and of the flux guidance element, the distance of the chip or the half-bridge resistors from the flux guidance element or details regarding sequential switching of magnetisation in order also to determine and eliminate offsets. The flux guidance element may take the form of a discrete unit and may be applied onto a chip substrate or board substrate by processes such as thick-film methods, electroplating or printing.

BRIEF DESCRIPTION OF THE DRAWINGS

Further advantages are revealed by the present description of the drawings. The drawings show exemplary embodiments of the invention. The drawings, description and claims contain numerous features in combination. A person skilled in the art will expediently also consider the features individually and combine them into meaningful further combinations.

In the drawings:

FIGS. 8-11: show a further exemplary embodiment of a 2D magnetic field sensor with 2 half-bridges, each half-bridge having two magnetoresistive resistors. Four different internal directions of magnetisation are specified in relation thereto and a sensitivity of the respective half-bridge voltages with an external magnetic field in the X and Z direction is stated;

DETAILED DESCRIPTION

Figure 1:
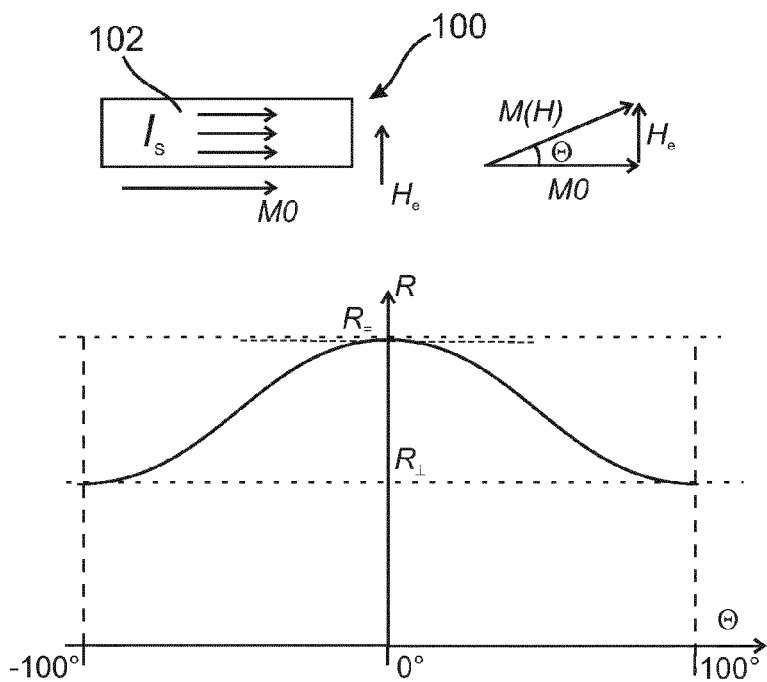
FIG. 1, FIG. 2: show prior art resistance strips with a barber's pole structure.

FIG. 1 shows a resistance characteristic curve as a function of a magnetic field M(H) relative to the direction of a measuring current flux $I_S$ through an AMR resistance strip 102 of a magnetic field sensor device 100. The resistance characteristic curve R(M) is determined by the formula $R=R_\perp+(R_\infty-R_\perp)\cos^2(\Theta)$, θ representing the angle between the current flow direction $I_S$ and an overall magnetic field M(H). The overall magnetic field M(H) is made up of a magnetic field of an internal premagnetisation $M_0$ and an external magnetic field $H_e$ which is to be measured. It can be seen that in the case of small magnetic fields $H_e<M_0$, only a slight change in resistance R occurs when the external magnetic field $H_e$ changes. Such a configuration is thus disadvantageous, because sensitivity to small magnetic fields is relatively low due to the resistance characteristic curve having only a shallow gradient in this region.

Figure 2:
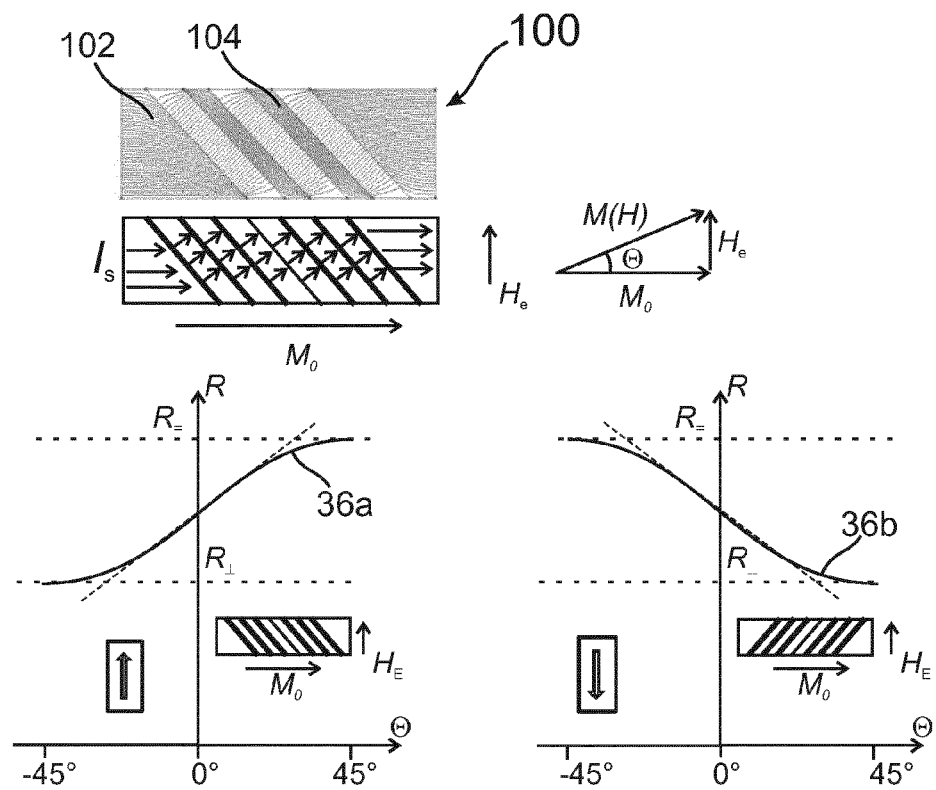

FIG. 2 shows a prior art AMR resistance device 100 in which an AMR resistance strip 102 is provided which has barber's pole structures 104, i.e. highly conductive metallised strips such as gold or copper metallised coatings, inclined at 45° on the AMR resistance strip 102. As shown in the schematic diagram, the AMR resistance strip 102 gives rise to a current flux $I_S$ through the AMR resistance strip 104 in a substantially 45° direction to the lengthwise extent of the resistance strip 102, such that the current flux adopts a linearisation angle α of 45° relative to a parallel internal magnetisation $M_0$ or a perpendicular external magnetic field $H_e$. Accordingly, the resistance curve shown in FIG. 1 is displaced, specifically in a region of a steep flank of the curve profile, in which resistance is linearly dependent on magnetic field, such that a slight change in an external magnetic field $H_e$ causes a linear change in the overall resistance R of the resistor of the AMR magnetic field sensor device. The sensitivity of the magnetic field sensor device can be distinctly increased thanks to linearisation by barber's pole structures.

Figure 3:
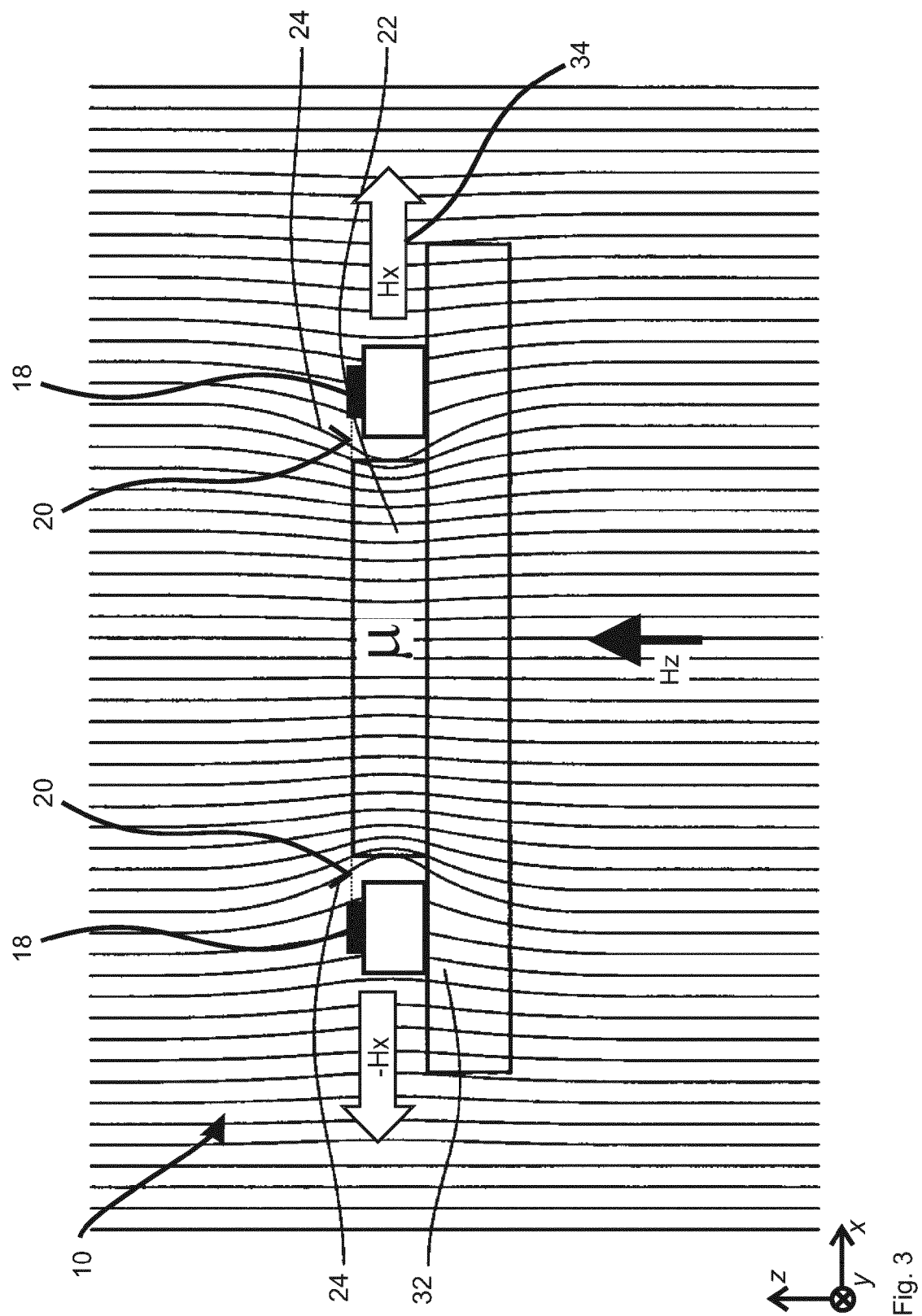
FIG. 3 shows a section through a Z-X plane of a chip arrangement of a first exemplary embodiment with flux concentration element.

The diagram in FIG. 3 is based on a diagram from DE 10 2008 041 859 A1 and is a first exemplary embodiment of a magnetic field sensor device 10 according to the invention. The magnetic field sensor device 10 shown schematically in FIG. 3 consists of a magnetically soft flux concentration element 22 which is located on the surface of a substrate 32, in this case a semiconductor chip as support for example of AMR sensors as magnetic field-sensitive bridge resistors 18. It is clear from FIG. 3 that for example flux lines of a magnetic field Hz 24 which is to be detected and is oriented in the Z direction are deflected at the peripheral zone of the flux concentration element 22 from their originally vertical Z direction into a horizontal X direction, such that said flux lines become measurable by the magnetic field-sensitive bridge resistors 18. Antisymmetric Hx components 34 are formed which act in opposing directions on the resistors 22 arranged adjacent to the peripheral zone of the element 22. Since the distance covered by the field lines 24 in the material of the flux concentration element 22 for the vertical to horizontal deflection is shorter than the distance covered for the horizontal to vertical deflection, a slight deflection effect is obtained, i.e. in relation to the Hz field strength of distinctly smaller Hx components which can be determined thanks to elevated sensitivity of the bridge resistors 30. In order to increase the measuring effect, the flux concentration element 22 may be countersunk in a manner which is not shown here into the substrate layer 32 of the semiconductor chip. The X/Y magnetic field sensor plane, i.e. the parallel plane to the chip substrate 32, in which Hx components bring about the greatest changes in resistance in the bridge resistors 18, is located at the level of the surface of the cuboidal flux concentration element 22. When the Hz component enters the flux concentration element 22, as shown in FIG. 3, the Hx components are at their highest level in the field strength profile of the Hz component and may accordingly be detected highly sensitively by the bridge resistors 18.

FIGS. 4 to 11 show two further exemplary embodiments of magnetic field sensor devices 10 according to the invention, in which AMR magnetic field resistors 18 with barber's pole structures are used, the resistance characteristic curves of which may be switched by a modification of an internal premagnetisation, as shown in FIG. 2. Reference signs are shown only in the upper subfigure of FIG. 4 they may be transferred mutatis mutandis to all of the further FIGS. 5 to 11 where they have been omitted for clarity's sake.

FIGS. 4 to 7 show a 2D magnetic field sensor device 10 which comprises two half-bridges 16a, 16b of a Wheatstone measuring bridge 14. A cuboidal flux concentration element 22 of a high permeability material such as for example Permalloy is arranged between the two half-bridges 16a, 16b. Each half-bridge 16a, 16b comprises a pair of two bridge resistors 30a-30c and 30b-30d respectively. The mutually associated lower bridge resistors 30a, 30b of the two half-bridges 16a, 16b take the form of magnetic field-sensitive bridge resistors 18a, 18b. The further associated bridge resistors 30c, 30d are ohmic resistors which are unaffected by magnetic fields. Each of the two magnetic field-sensitive resistors 18a, 18b has a resistance characteristic curve 36a and 36b respectively, which are indicated by black arrows and correspond to the resistance characteristic curves 36a, 36b shown in FIG. 2.

Figure 4:
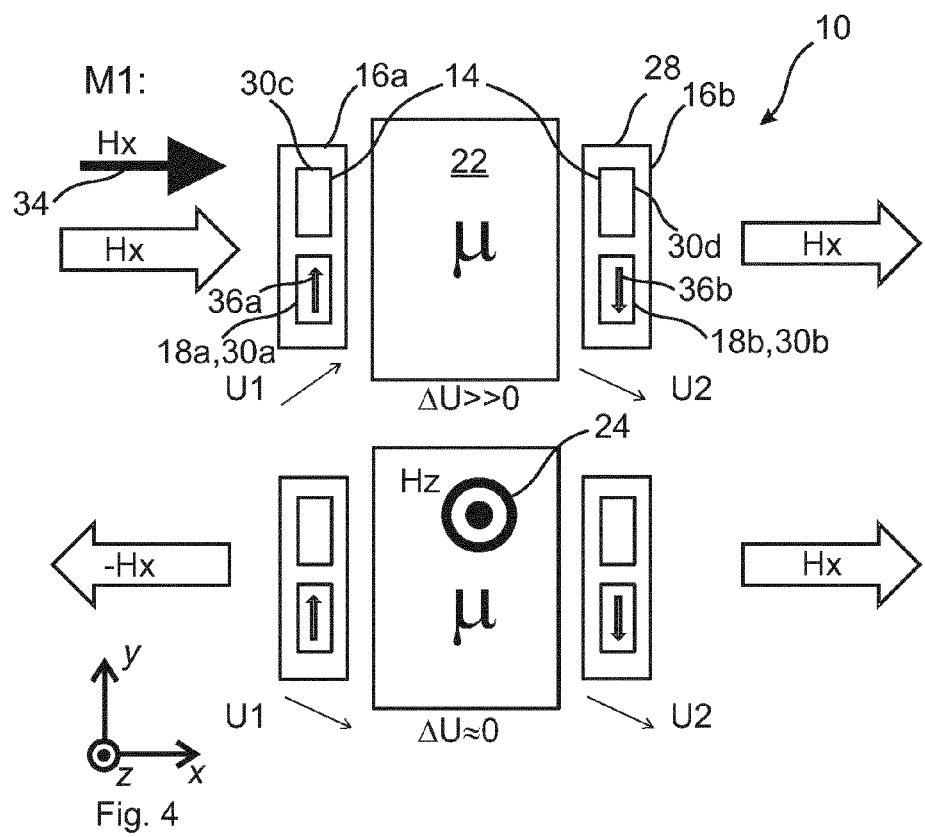
FIGS. 4-7: show a further exemplary embodiment of a 2D magnetic field sensor with 2 half-bridges, each half-bridge having only one magnetoresistive resistor. Four different internal directions of magnetisation are specified in relation thereto and a sensitivity of the respective half-bridge voltages with an external magnetic field in the X and Z direction is stated.

FIG. 4 shows a first state M1, in which resistor 18a has a resistance characteristic curve 36a shown on the left in FIG. 2 and resistor 18b has a resistance characteristic curve 36b, shown on the right in FIG. 2, with regard to an Hx component 34. As is clear from the upper subfigure of FIG. 4, when the Hx component 34 increases, the voltage U1 of the first half-bridge 16a rises while the voltage U2 of the second half-bridge 16b falls, such that the differential voltage ΔU is enlarged. The lower subfigure of FIG. 4 shows behaviour with regard to a Z magnetic field component 24 Hz. The Hz component 24 brings about an Fix component in the negative X direction with regard to the first half-bridge 16a and an antisymmetric Hx component in the positive X direction with regard to the second half-bridge 16b. Consequently, in the specified state M1, the two half-bridge voltages U1, U2 fall, such that the differential voltage ΔU tends towards zero.

Figure 5:
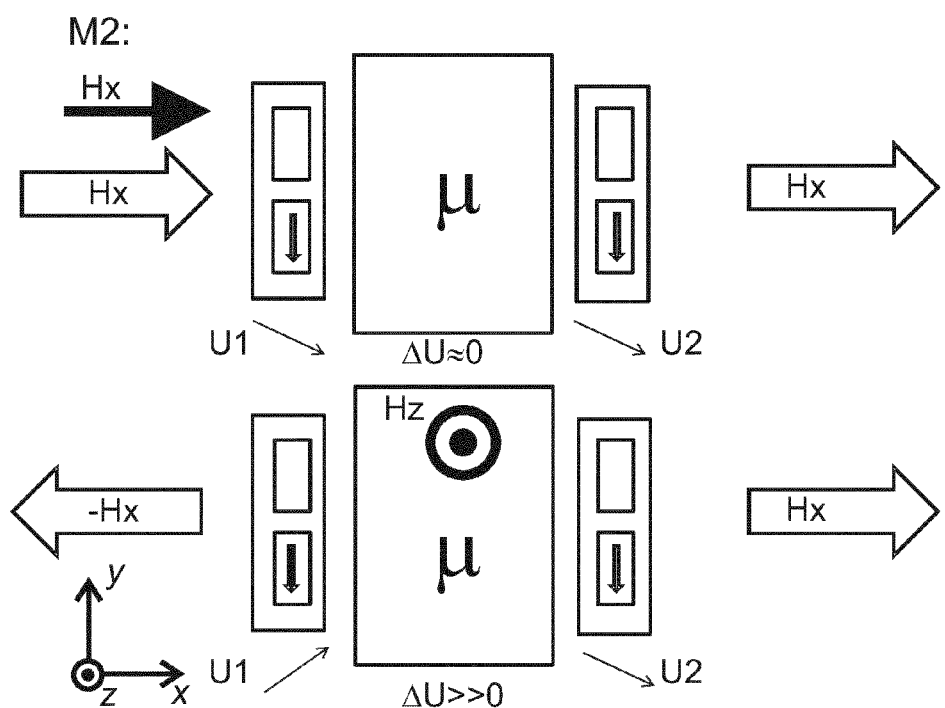

FIG. 5 shows with regard to a second state M2, in which both resistors 18a, 18b follow a right-hand resistance characteristic curve 36b of FIG. 2, behaviour of the magnetic field sensor device in response to an Hx and Hz component. In this case, an Hx component 34 brings about a differential voltage ΔU which tends towards zero and an Hz component 24 brings about a positively rising differential voltage ΔU.

Figure 6:
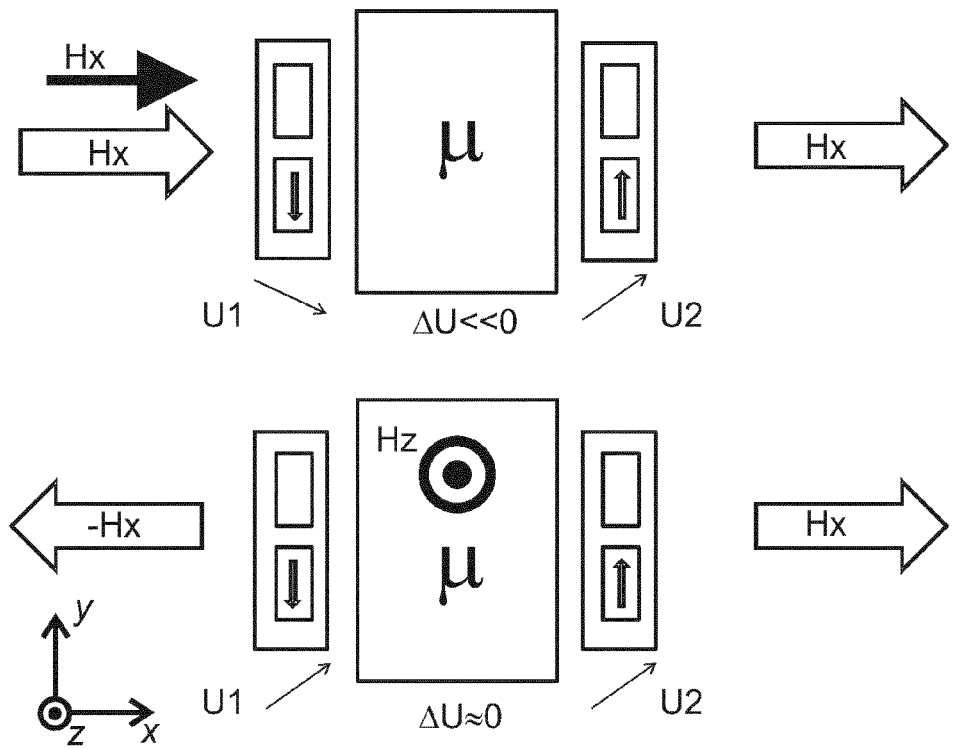
Figure 7:
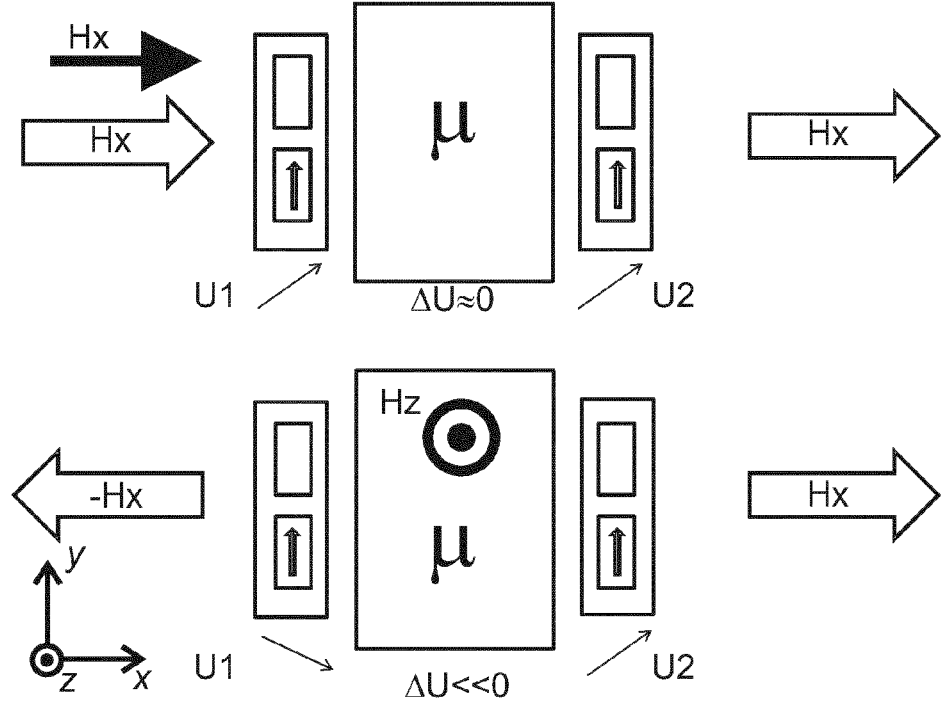

FIG. 6 shows a state M3 which corresponds to the state M1 of FIG. 4, but the two resistors 18a, 18b now have antisymmetric resistance characteristic curves 36b and 36a respectively. The same applies to FIG. 7 with state M4 in respect of state M2 of FIG. 5.

Figure 10:
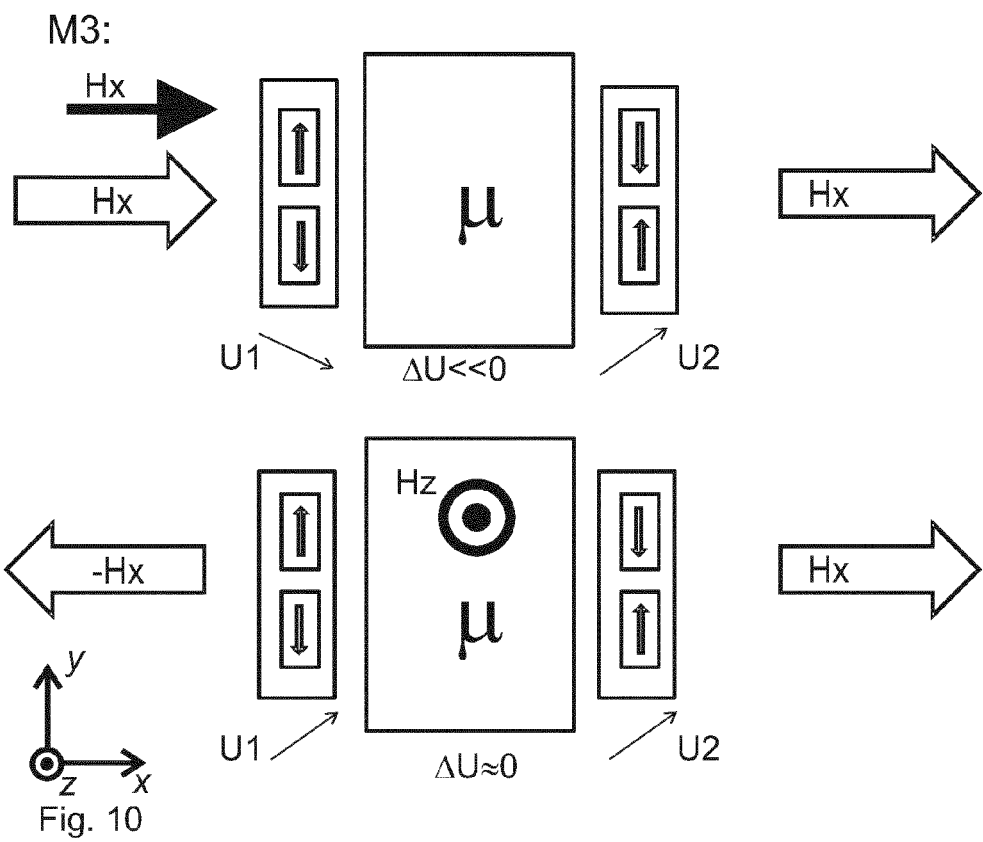
Figure 11:
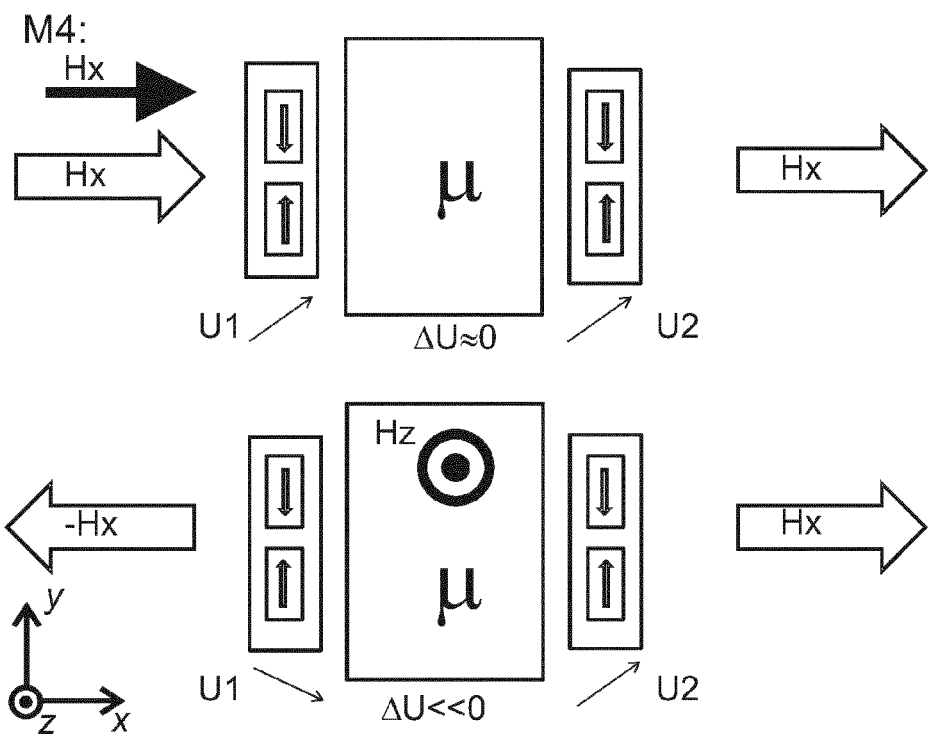

FIGS. 8 to 11 show further exemplary embodiments of a 2D magnetic field sensor device 10, wherein all the bridge resistors 30 are magnetic field-sensitive resistors 18. FIG. 8, which corresponds to FIG. 4, shows a first state M1 of the four bridge resistors 18a to 18d shown in the drawings. FIGS. 9 to 11 show further states M2 to M4 corresponding to FIGS. 5 to 7. States M1 and M3 correspond to one another, wherein the characteristic curve profiles 36a, 36b of resistors 18a to 18d are antisymmetric in pairs. The same applies to states M2 and M4 with symmetrical resistance characteristic curves 36a, 36b of the respectively associated lower and upper resistors 18a-18b and 18c-18d in half-bridges 16a, 16b. An upper subfigure shows voltage behaviour U1, U2 with regard to an Fix component 34 and a lower subfigure shows voltage behaviour U1, U2 with regard to an Hz component 24.

States M1, M3 may be used for determining the direction and strength of the Hx component 34 and states M2, M4 for determining the direction and strength of the Hz component 14.

Figure 12:
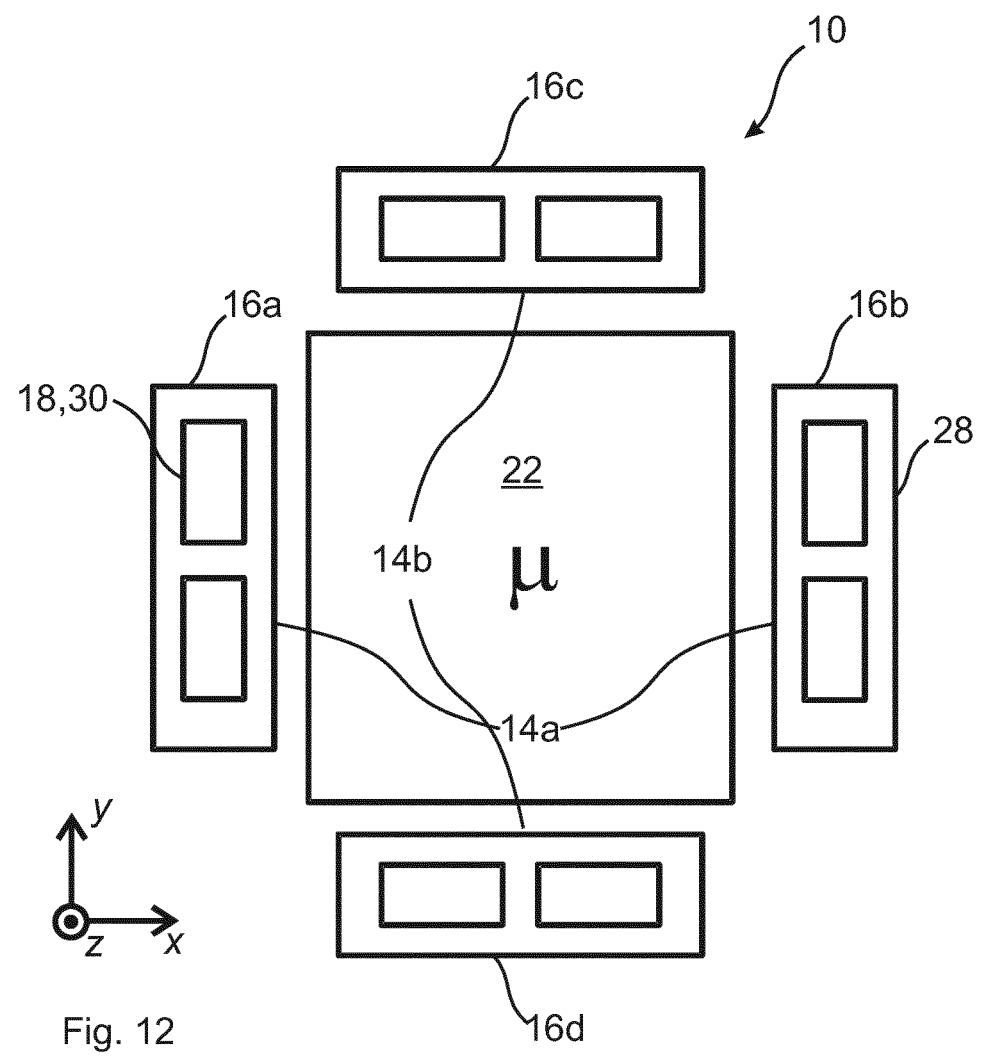
FIG. 12: Shows a farther exemplary embodiment of a 3D magnetic field sensor for measuring all three components of an external magnetic field.

FIG. 12 shows a further exemplary embodiment of a magnetic field sensor device 10 for determining three-dimensional magnetic field profile by means of two Wheatstone measuring bridges 14a, 14b. In the case of a 3D sensor device 10, the flux concentration element 22 has a substantially square shape, wherein thanks to the definition of a plurality of states not only an Hx but also an Hy and an Hz component may be determined by means of two differential voltages ΔUa and ΔUb. The magnitude of the Hz component may be detected both by measuring bridge 14a and by measuring bridge 14. Increased accuracy may be achieved by averaging the two determined Hz values.

Figure 13A:
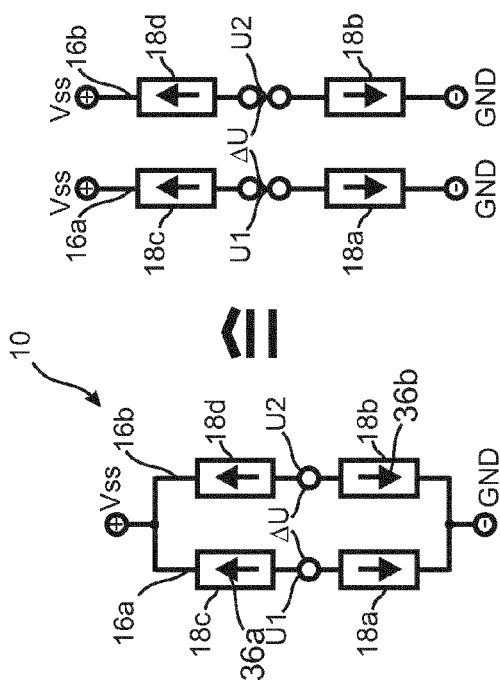
FIG. 13: shows an exemplary embodiment regarding circuit switching of various directions of sensitivity of a magnetic field sensor device according to the invention. Identical elements are denoted with identical reference signs in the figures.
Figure 13B:
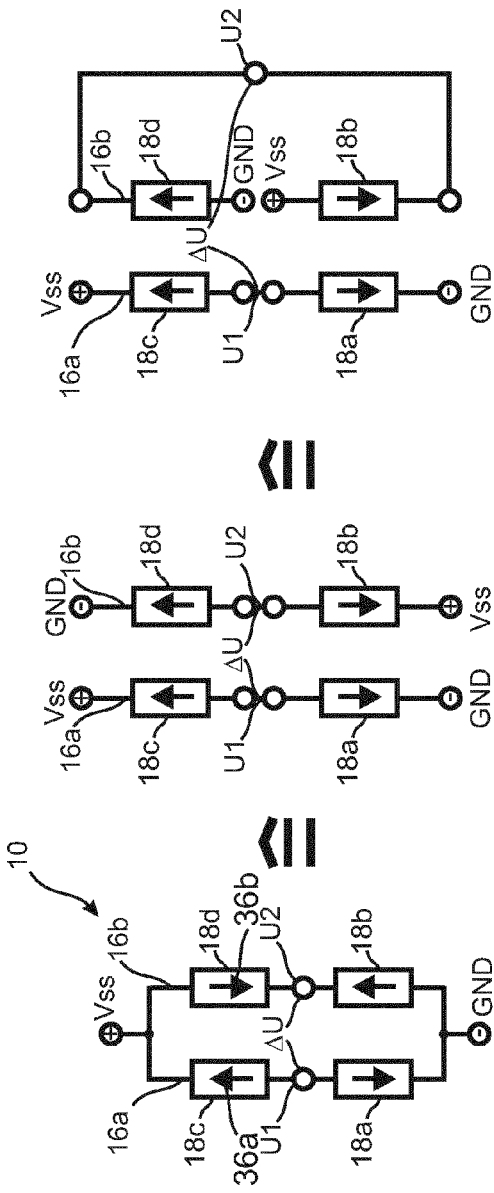

Finally, FIG. 13a and FIG. 13b show electrical equivalent circuit diagrams of a further exemplary embodiment of a magnetic field sensor device 10. FIG. 13a accordingly shows in the left-hand subfigure a bridge circuit which corresponds to the configuration of FIG. 9 as state M2. The arrangement is sensitive for measuring components in the Z axis. If all the terminal contacts of the bridge resistors 18a to 18d are mutually independently contactable, the right-hand subfigure of FIG. 13a shows the individual bridge resistors 18a to 18d in contact with the supply voltage Vss, the ground potential GND or the centre tap voltages U1, U2 and the resultant differential voltage ΔU=U1−U2.

FIG. 13b shows three configurations based on FIG. 13a which, in comparison with FIG. 13a, have a direction of sensitivity in the X direction. In addition to switching of the direction of magnetisation of elements 18d and 18b (left-hand subfigure), switching of the direction of sensitivity is achieved by switching the supply voltage of the right-hand half-bridge 16b (middle subfigure), or by swapping the circuit arrangement of resistors 18b and 18d in the right-hand half-bridge 16b in comparison with FIG. 13a.

The invention combines the deflection of a perpendicular magnetic field component with the assistance of a ferromagnetic flux concentration element into antisymmetric magnetic field components in the sensor plane with the advantages for switching and/or flipping the direction of sensitivity, wherein a measurement offset may be eliminated by suitable evaluation electronics.

The invention claimed is:

1. A magnetic field sensor device for determining two or three components of a magnetic field, comprising at least one Wheatstone bridge with two half-bridges, each half-bridge comprising at least two bridge resistors and at least one of the two bridge resistors being a magnetic field-sensitive resistor with regard to a magnetic field component located in an X/Y magnetic field sensor plane, a ferromagnetic flux concentration element being arranged symmetrically between the two bridge resistors which, with regard to a Z magnetic field component oriented perpendicular to the X/Y magnetic field sensor plane, generates antisymmetric magnetic field components located in the X/Y magnetic field sensor plane, wherein at least one of the circuit arrangement of the bridge resistors is individually switchable, the supply voltage of at least one half-bridge is individually switchable, and at least one of the magnetic field-sensitive bridge resistors have a switchable resistance characteristic curve so as to enable switching of at least one resistance characteristic curve, wherein in a first state an X/Y-located magnetic field component is measurable and in a second state a magnetic field component located in the Z direction is measurable.

2. A magnetic field sensor device according to claim 1, wherein the magnetic field-sensitive bridge resistors are AMR, GMR or TMR resistors.

3. A magnetic field sensor device according to claim 1, wherein at least one premagnetisation switching unit, in particular a flip conductor, is included which is capable of flipping, i.e. reversing an internal magnetisation of said bridge resistors for defining the resistance characteristic curve (36) of at least one magnetic field-sensitive bridge resistor.

4. A magnetic field sensor device according to claim 1, wherein all the resistors of the Wheatstone measuring bridge are magnetic field-sensitive resistors.

5. A magnetic field sensor device according to claim 1, wherein two Wheatstone measuring bridges (14a, 14b) are comprised, wherein the orientation of the measurement-sensitive magnetic field components, located in the X/Y magnetic field sensor plane, of the two measuring bridges is perpendicular to each other.

6. A magnetic field sensor device according to claim 1, wherein the ferromagnetic flux concentration element (22) consists of iron, cobalt, nickel, a ferromagnetic alloy such as AlNiCo, SmCo, Nd2Fe14B, Ni80Fe20, NiFeCo alloy or a combination thereof.

7. A magnetic field sensor device according to claim 1, wherein the ferromagnetic flux concentration element has a symmetrical shape, in particular a mirror-symmetrical or rotationally symmetrical shape, in particular a rectangular, in particular a square shape in the X/Y magnetic field sensor plane, in which the side edges of the flux concentration element are preferably oriented in the X/Y direction.

8. A magnetic field sensor device according to claim 1, wherein an upper or a lower surface of the flux concentration element is located in the X/Y magnetic field sensor plane.

9. A method for determining two or three components of a magnetic field by a magnetic field sensor device according to claim 1, comprising
   switching of at least one of the resistance characteristic curves of mutually associated magnetic field-sensitive resistors of the two half-bridges or switching of the circuit arrangement of the bridge resistors in at least one half-bridge, wherein in a first state M1, M3 an X/Y-located magnetic field component is measurable by oppositely directed resistance profiles of mutually corresponding magnetic field-sensitive bridge resistors and in a second state M2, M4 a magnetic field component located in the Z direction is measurable by identically directed resistance profiles of mutually corresponding magnetic field-sensitive bridge resistors, and
   bringing about a voltage change at the centre tap of the half-bridge in a first change in magnitude and, in the Z direction perpendicular to the X/Y sensor plane, a different voltage change in a second change in magnitude with a magnetic field sensor component located in an X/Y sensor plane in the two half-bridges.

10. A method according to claim 9 wherein switching of the states proceeds in the sequence M1, M2, M1 and M2 or M1, M2, M3 and M4.

11. A method according to claim 9, wherein a voltage offset of the measuring bridge is filtered out by an evaluation unit.

* * * * *